(12) United States Patent
Lin et al.

(10) Patent No.: US 10,107,461 B2
(45) Date of Patent: Oct. 23, 2018

(54) LIGHT-EMITTING DISPLAY AND METHOD FOR FORMING THE SAME

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: Jen-Lung Lin, New Taipei (TW); Ju-Ling Cheng, New Taipei (TW); Ming-Kun Weng, New Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 149 days.

(21) Appl. No.: 15/402,280

(22) Filed: Jan. 10, 2017

(65) Prior Publication Data

US 2017/0336035 A1    Nov. 23, 2017

(30) Foreign Application Priority Data

May 18, 2016 (CN) .......................... 2016 1 0333279

(51) Int. Cl.
| | |
|---|---|
| *H01L 33/60* | (2010.01) |
| *F21K 9/68* | (2016.01) |
| *F21K 9/64* | (2016.01) |
| *F21K 9/90* | (2016.01) |
| *F21V 7/00* | (2006.01) |
| *H01L 25/075* | (2006.01) |
| *F21Y 115/10* | (2016.01) |
| *H01L 33/50* | (2010.01) |

(52) U.S. Cl.
CPC .................. *F21K 9/68* (2016.08); *F21K 9/64* (2016.08); *F21K 9/90* (2013.01); *F21V 7/00* (2013.01); *H01L 25/0753* (2013.01); *F21Y 2115/10* (2016.08); *H01L 33/507* (2013.01); *H01L 33/60* (2013.01); *H01L 2224/48091* (2013.01)

(58) Field of Classification Search
CPC .................. H01L 33/60; H01L 33/507; H01L 224/48091; H01L 25/0753; F21K 9/68; F21K 9/64; F21K 9/90; F21Y 2115/10
See application file for complete search history.

(56) References Cited

U.S. PATENT DOCUMENTS

9,541,255 B2 * 1/2017 Sferra .................... F21V 7/0066
9,728,684 B2 * 8/2017 Watanabe ............... F21V 13/14
(Continued)

*Primary Examiner* — Mary Ellen Bowman
(74) *Attorney, Agent, or Firm* — Li & Cai Intellectual Property (USA) Office (57) ABSTRACT

A light-emitting display has a circuit board, a spacer, a phosphor film, and a housing. The circuit board is provided with at least one light source. The spacer is disposed on a top surface of the circuit board. The spacer has a through hole which runs through the spacer from top to bottom and corresponds to the at least one light source and the phosphor film respectively. The housing has a reflecting portion and an accommodating space below the reflecting portion. The reflecting portion is located over the phosphor film. The accommodating space accommodates the circuit board, the spacer, and the phosphor film. The present disclosure also provides a method for forming the light-emitting display.

20 Claims, 11 Drawing Sheets

(56) References Cited

U.S. PATENT DOCUMENTS

| | | | |
|---|---|---|---|
| 2003/0230751 A1* | 12/2003 | Harada | H01L 33/44 257/80 |
| 2007/0085103 A1* | 4/2007 | Nishioka | H01L 33/507 257/99 |
| 2013/0077295 A1* | 3/2013 | Hayashi | F21V 29/00 362/217.05 |
| 2015/0252258 A1* | 9/2015 | Konishi | C09K 11/77 438/29 |

* cited by examiner

LIGHT-EMITTING DISPLAY AND METHOD FOR FORMING THE SAME

TECHNICAL FIELD

The present disclosure relates to a light-emitting display and a method for forming the same, and in particular, to a light-emitting display combined with a light source such that after a light ray of the light source passes through a fluorescent material and is reflected by a reflecting portion, a particular character, symbol, or color is displayed on a surface of an electronic product.

BACKGROUND ART

An approach adopted in light-emitting displays (number displays) in the prior art is to combine a circuit board having a light source (such as LED chip) or a chip on board (COB) type LED to a reflecting portion, so as to generate a desired luminous character, symbol, or color.

In the prior art, the reflecting portion needs to have a certain thickness and is filled with an encapsulant and a diffusing agent, to prevent a light source of the light-emitting diode from forming a point light source through the reflecting portion. In addition, a relatively large number of light-emitting diodes need to be close to each other if large-area illumination is required, so as to reduce the point light source phenomenon.

SUMMARY OF THE PRESENT INVENTION

The present disclosure provides a light-emitting display, which uses a phosphor film having a fluorescent material in combination with a spacer having a certain thickness, such that light rays emitted by a light source form an area light source and then enter a reflecting portion, thus solving a bright dot phenomenon of a point light source in the prior art, making the illumination more uniform, reducing a diffusing agent inside the reflecting portion, and making a product thinner.

In order to further understand the techniques, methods, and effects adopted by the present disclosure, reference can be made to the detailed description and drawings of the present disclosure, whereby the objectives, features, and characteristics of the present disclosure can be understood deeply and specifically. However, the accompanying drawings and appendixes are only provided for reference and illustration, and are not used to limit the present disclosure.

DETAILED DESCRIPTION OF EMBODIMENTS

First Embodiment

Figure 1:
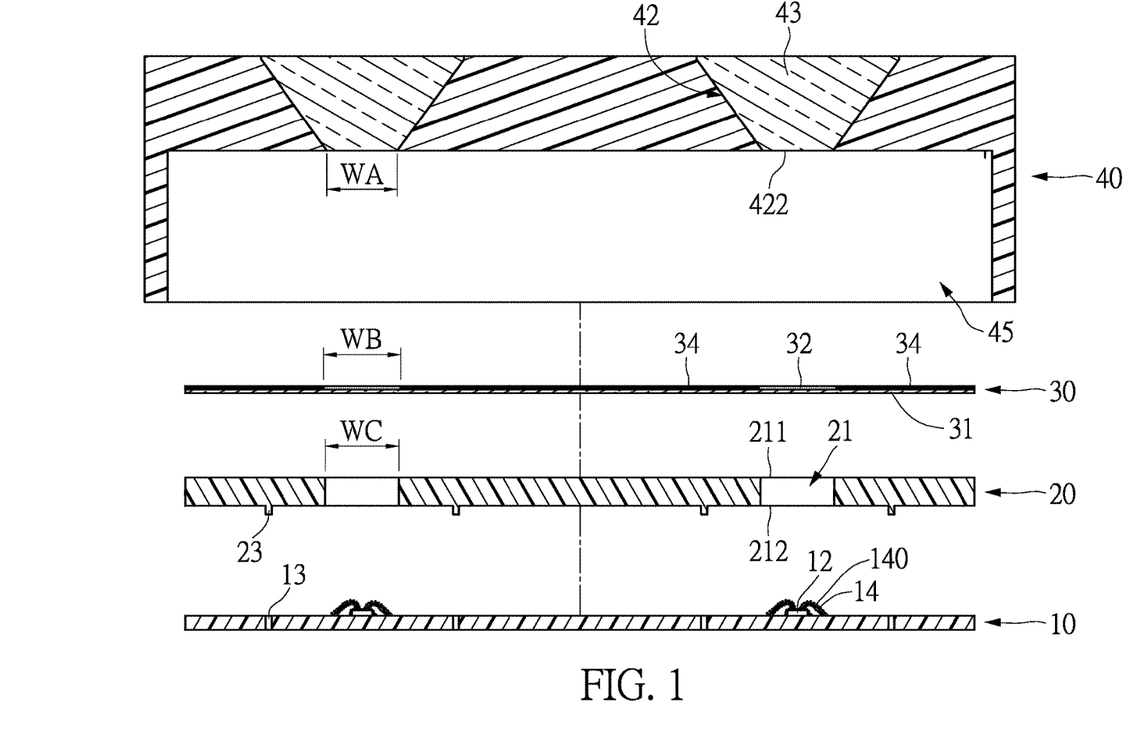
FIG. 1 is a schematic exploded diagram of a first embodiment of a light-emitting display according to the present disclosure.

Please refer to FIG. 1, which is a schematic exploded diagram of a first embodiment of a light-emitting display according to the present disclosure. The present disclosure provides a light-emitting display, which has a circuit board 10, a spacer 20, a phosphor film 30, and a housing 40.

The circuit board 10 is provided with at least one light source 12, such as light-emitting diode chip where the light source 12 may be a chip on board (COB) type LED that is connected to a welding pad on a surface of the circuit board 10 through a wire 14. However, the present disclosure is not limited thereto. For example, the light source 12 may also be a flip-chip type LED, or the like. The light source 12 in the present embodiment may be a blue LED with a light ray in a range of about 400 nm to 480 nm, and preferably a high-brightness blue LED having a wavelength of 445 to 475 nm may be used with a red, green, or yellow phosphor, so as to excite light rays of different colors. To control a light-emitting color point region of the light-emitting display, the light source 12 preferably has a selected wavelength range. For example, the wavelength may range from 465 nm to 467.5 nm.

The spacer 20 is disposed on a top surface of the circuit board 10 and has a first side and a second side. The spacer 20 defines a first optical path extending from the first side of the spacer 20 to the second side of the spacer 20. The light source 12 is mounted directly to a portion of the first side of the spacer 20 opposite the second side of the spacer 20 such that first light ray emitted by the light source 12 propagates from the light source 12 to the second side of the spacer 20 via the first optical path. The spacer 20 has at least one through hole 21, and the position of the through hole 21 corresponds to the light source 12. Preferably, the position of the through hole 21 corresponds to a desired pattern of the light-emitting display of the present disclosure. For example, the desired display pattern of the light-emitting display of the present disclosure is seven segments of the digit 8, and the positions of the through holes 21 also correspond to the seven segments of the digit 8. In the present embodiment, one light source 12 is disposed in one through hole 21. However, the present disclosure is not limited thereto, and multiple light sources may be disposed in one through hole, which will be described in the following embodiments. An upper opening 211 corresponding to the through hole 21 is provided on a top surface of the spacer 20, and a lower opening 212 corresponding to the through hole 21 is provided on a bottom surface of the spacer 20. The through hole 21 may have a constant width, or the width of the upper opening 211 is greater than that of the lower opening 212. In the present embodiment, the thickness of the spacer 20 is preferably greater than or equal to the height of the light source 12. For example, when the chip has a height of 0.15 mm and wire bonding is adopted, the thickness of the spacer 20 is preferably greater than 0.4 mm.

Figure 2:
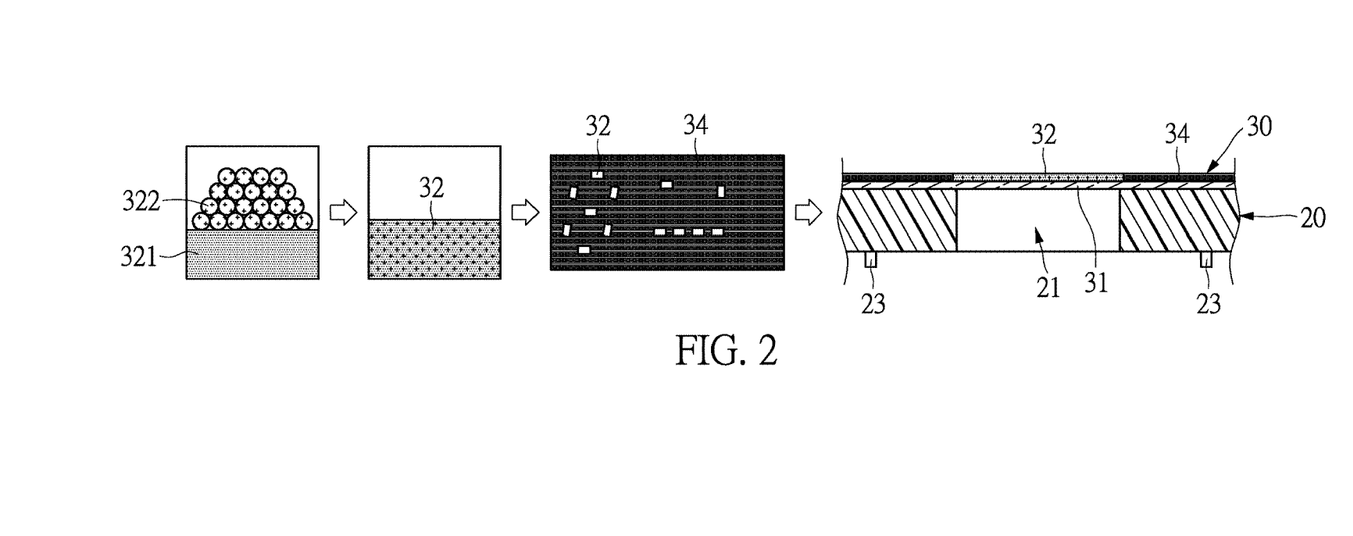
FIG. 2 is a schematic diagram of a manufacturing process of a phosphor film in the first embodiment of the present disclosure.

Please refer to FIG. 2, which is a schematic diagram of a manufacturing process of a phosphor film of the present disclosure. The phosphor film 30 is associated with the first side of the spacer 20, and containing a first fluorescent material and capable of emitting a second light ray when excited by the first light ray. In this embodiment, the phosphor film 30 can be a curable resin 321 and a fluorescent material 322 to be mixed with the curable resin 321. Concerning the fluorescent material, for example, the yellow phosphor can be a garnet type phosphor having a garnet type crystal structure such as $Y_3Al_5O_{12}$:Ce (YAG (yttrium aluminum garnet):Ce), an oxynitride phosphor such as Ca-α-SiAlON. In a mixing process, the fluorescent material 322 and the curable resin 321 are mixed at a corresponding ratio according to a desired display color of the light-emitting display. The mixture (as indicated by the reference numeral 32) of the fluorescent material 322 and the curable resin 321 is stirred evenly. A shading layer 34 is coated on a transparent substrate 31 with a plurality of uncovered areas in a desired display pattern. The mixture (as indicated by the reference numeral 32) is coated on the transparent substrate 31 in the desired display pattern to form a first fluorescent material mixed layer 32. The shading layer 34 may be a black ink layer, which can prevent side light leakage when the first fluorescent material mixed layer 32 emits light. A printing screen or a mask may be used for the desired display pattern. A position of the phosphor film 30 corresponds to the upper opening 211 of the spacer 20. That is, a position of the through hole 21 also corresponds to the phosphor film 30. Furthermore, the position of the shading layer 34 corresponds to a region on the top surface of the spacer 20 other than the upper opening 211, that is, the position of the shading layer 34 corresponds to a region other than the region of the desired display pattern.

The phosphor film 30 has a transparent substrate 31, a first fluorescent material mixed layer 32 that is located on the transparent substrate 31 and has the desired display pattern, and a shading layer 34 surrounding the desired display pattern, wherein the phosphor film 30 is disposed on the top surface of the spacer 20.

It should be additionally noted that, in the present embodiment, after the light source 12 is fixed to the circuit board 10 and wire bonding is performed, a layer of a light-transmissive member 140 is optionally sprayed on the light source 12 to protect the light source 12 and the wire 14. The light-transmissive member 140 may have a second fluorescent material (not shown), which is, for example, adding a red phosphor in consideration of the color temperature. Based on the second fluorescent material mentioned herein, the above-mentioned fluorescent material 322 may be referred to as a first fluorescent material to distinguish one from the other. Concerning the red phosphor, for example, the red phosphor can be nitride phosphor such as $CaAlSiN_3$:Eu and $CaSiN_2$:Eu.

Figure 3:
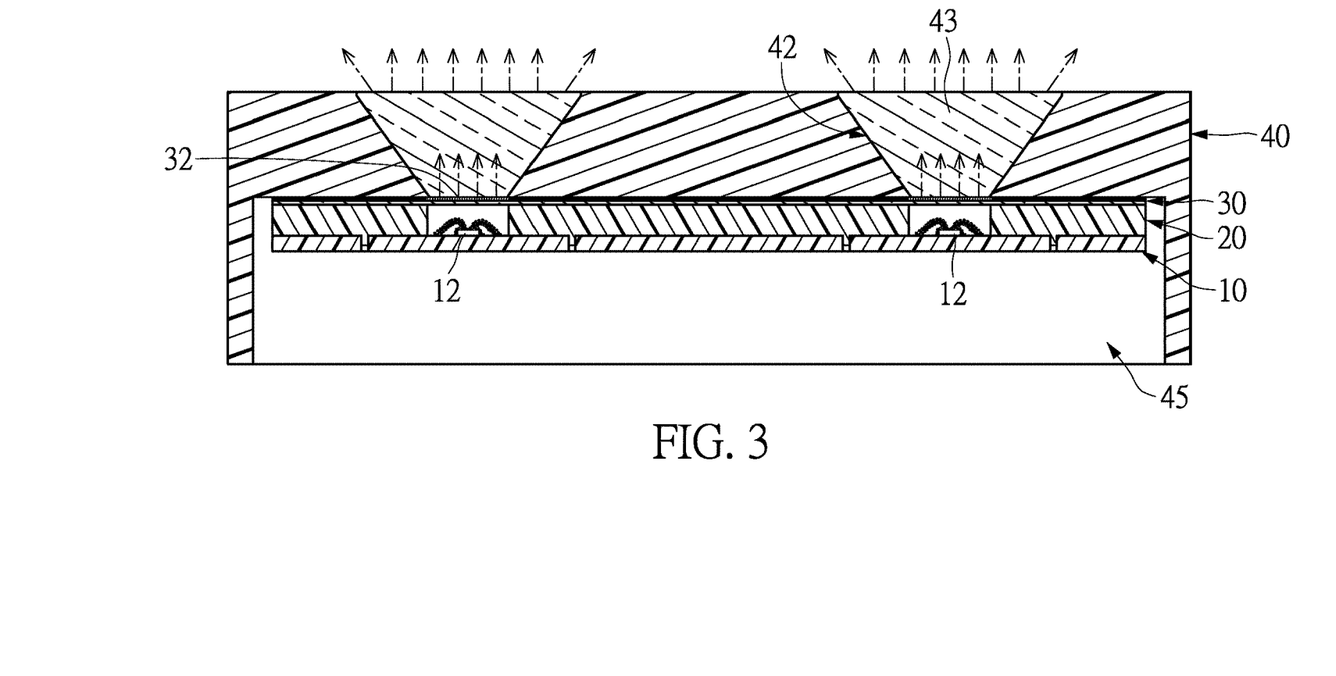
FIG. 3 is a cross-sectional assembly diagram of the first embodiment of the light-emitting display according to the present disclosure.

As shown, FIG. 3 is a cross-sectional assembly diagram of the light-emitting display according to the present disclosure. The housing 40 is disposed above the spacer 20 and the circuit board 10, and has at least one reflecting portion 42 and an accommodating space 45 below the reflecting portion 42. The reflecting portion 42 is located over the phosphor film 30. More specifically, the reflecting portion 42 is located over the first fluorescent material mixed layer 32. The accommodating space 45 accommodates the circuit board 10, the spacer 20, and the phosphor film 30. The reflecting portion 42 is located over the phosphor film 30 and defining a second optical path extending from the first side of the reflecting portion 42 to the second side of the reflecting portion 42 such that second light ray propagates from the phosphor film 30 to the second side of reflecting portion 42 via the second optical path. In the light-emitting display of the present disclosure, after traveling over a distance (a distance defined by the spacer 20) and becoming diffused, a first light ray of point-type light emitted by the light source 12 excites the fluorescent material 322 on the phosphor film 30 located on a light output path to generate a second light ray of area-type light, which is then reflected out by the reflecting portion 42. In the present embodiment, the light ray first passes through the evenly printed or sprayed phosphor film 30 to form an area light source, and then a uniform light output surface is presented through the reflecting portion 42.

In addition, to allow the spacer 20 to be accurately fixed on the circuit board 10, corresponding engaging structures are disposed on both the spacer 20 and the circuit board 10. As shown in FIG. 1, in the present embodiment, the bottom surface of the spacer 20 has multiple locating projections 23, and the circuit board 10 is provided with locating holes 13 corresponding to the multiple locating projections 23. The present disclosure is not limited to the aforementioned engaging structures, for example, the engaging structures of the spacer 20 and the circuit board 10 may be swapped with each other. In other words, if the bottom surface of the spacer 20 has multiple locating holes, the circuit board 10 is provided with locating projections corresponding to the multiple locating holes.

Please refer to FIG. 1. In the present embodiment, a bottom surface of the housing 40 has a bottom opening 422 corresponding to the reflecting portion 42. During assembly, the phosphor film 30 is adhered to the top surface of the spacer 20. Then, an assembly structure of the circuit board 10, the spacer 20, and the phosphor film 30 is placed in the accommodating space 45 at the bottom surface of the housing 40, and the first fluorescent material mixed layer 32 of the phosphor film 30 is made to be aligned with the bottom opening 422 of the reflecting portion 42. In a preferable dimensional arrangement of the present embodiment, a width WA of the bottom opening 422 is less than or equal to a width WB of the first fluorescent material mixed layer 32, and the width WB of the first fluorescent material mixed layer 32 is greater than or equal to a width WC of the upper opening 211 of the spacer 20. With this arrangement, light rays that pass through the bottom opening 422 of the reflecting portion 42 can be completely excited by the first fluorescent material mixed layer 32, thus having a desirable light emitting effect.

Figure 3A:
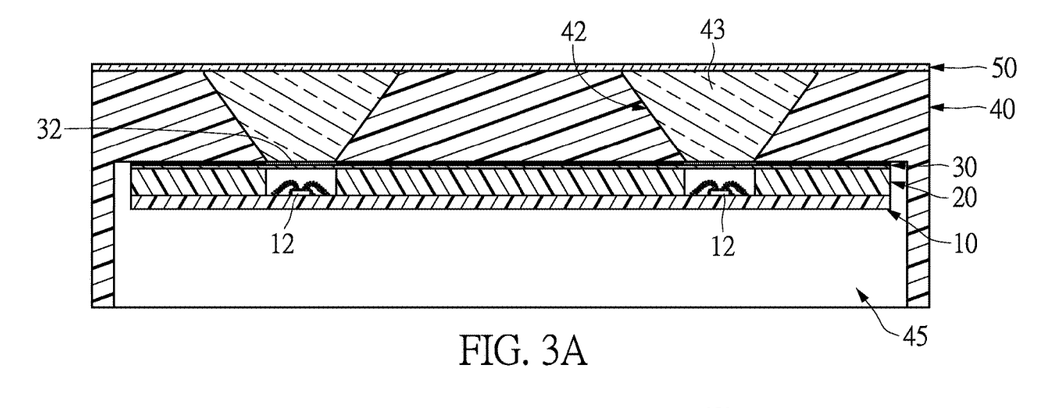
FIG. 3A to FIG. 3D are cross-sectional assembly diagrams of different implementations of the first embodiment of the light-emitting display according to the present disclosure.
Figure 3B:
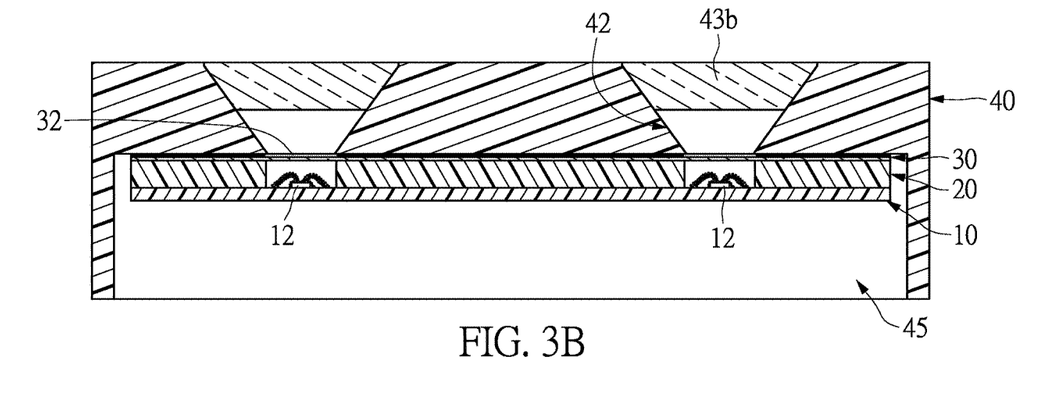
Figure 3C:
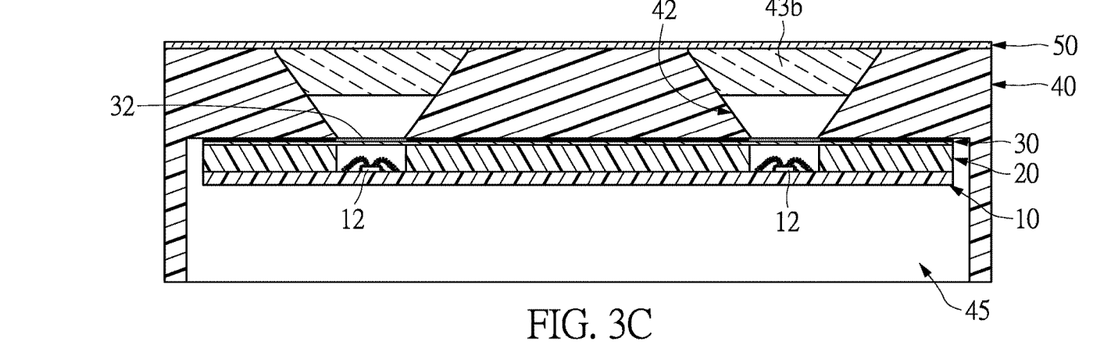

Please refer to FIG. 3A to FIG. 3C, which are cross-sectional assembly diagrams of different implementations of the light-emitting display according to the present disclosure. The reflecting portion 42 of the housing 40 is filled with an encapsulant to form an encapsulation 43. A method for filling the encapsulation 43 into the housing 40 is: adhering a temporary sealing tape (not shown) to an upper surface of the housing 40, then placing the housing 40 upside down on a plane surface, pouring an encapsulant from the bottom of the reflecting portion 42 up, and removing the temporary sealing tape after baking is finished. A top surface of the encapsulation (43, 43b) is expected to be flush with or to be slightly recessed relative to the upper surface of the housing 40. In other words, the combination of the encapsulation (43, 43b) and the reflecting portion 42 of the housing 40 provides an approximately flat top surface (a light output surface) of the light-emitting display. As shown in FIG. 3A, the entire reflecting portion 42 is filled up with the encapsulation 43. The thickness of the encapsulation 43 may be equal to the thickness of the housing 40, an upper surface of the encapsulation 43 is flush with the top surface of the housing 40, and a lower surface of the encapsulation 43 is flush with a top surface of a phosphor film 30. As shown in FIG. 3B and FIG. 3C, the housing 40 may be turned upside down, and a predetermined amount of the encapsulation 43b is filled into part of the reflecting portion 42, such that the upper surface of the encapsulation 43b is flush with the top surface of the housing 40, the lower surface of the encapsulation 43b is spaced from the phosphor film 30' with a gap between the two. Also, the thickness of the encapsulation 43b is made to be less than the thickness of the housing 40, and therefore the overall weight of the light-emitting display can be reduced. Moreover, as shown in FIG. 3A and FIG. 3C, the light-emitting display of the present disclosure may further have an overlayer 50 to display a desired character or pattern of a product, and the overlayer 50 covers the top surface of the housing 40.

It should be additionally noted that, to meet the requirement of the aforementioned high-temperature process of the encapsulant filling for forming the encapsulation 43, which may reach a temperature of 90 to 110 degrees Celsius, the transparent substrate 31 is preferably made of a material with a melting point of higher than 90 degrees Celsius, and the hardness of the transparent substrate 31 is greater than a hardness of 1H on the Mohs scale. However, the bottom surface of the encapsulation 43b in FIG. 3B or FIG. 3C is not in contact with the phosphor film 30. Therefore, the material requirement of the transparent substrate 31 is not limited to the aforementioned conditions.

Figure 3D:
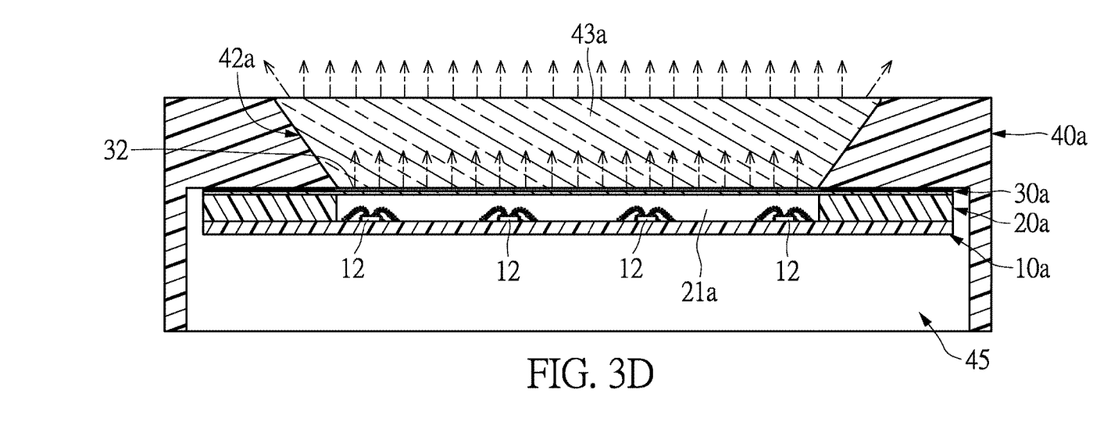

Please refer to FIG. 3D, which is a cross-sectional assembly diagram of a light-emitting display having multiple light sources according to the present disclosure. The main difference from the embodiment shown in FIG. 3 lies in that, a circuit board 10a of the present embodiment has four light sources 12. There may be a multiple numbers of the light sources 12, for example, two, four, or more. In addition, the multiple light sources 12 may be arranged linearly or in an array. Corresponding to the multiple light sources 12, a spacer 20a is provided with a relatively larger through hole 21a capable of accommodating four light sources 12. Moreover, the first fluorescent material mixed layer 32 of the phosphor film 30a has a width slightly greater than that of the through hole 21a, and is wide enough to cover the multiple light sources 12. A bottom width of a reflecting portion 42a of a housing 40a is slightly less than that of the first fluorescent material mixed layer 32, and the reflecting portion 42a may be filled up with an encapsulant to form an encapsulation 43a. Many first light rays of point-type light emitted by the light sources 12 excites the first fluorescent material mixed layer 32 on the phosphor film 30a located on a light output path to generate a second light ray of area-type light, which is then reflected out through the encapsulation 43a by the reflecting portion 42a. The advantage of the present embodiment lies in a wider light emitting angle, and compared with the prior art, the present embodiment can achieve, on the premise of the same display range, a uniform illumination effect by using less light sources 12 with a relatively wider phosphor film 30a, thereby reducing costs.

It can be understood that the embodiment shown in FIG. 3D may have variations similar to those shown in FIG. 3A to FIG. 3C, that is, an overlayer (not shown) may be disposed on the top surface of the reflecting portion 42a; the encapsulation 43a may be filled into part of the reflecting portion (not shown), such that an upper surface of the encapsulation 43a is flush with the top surface of the housing 40a, a lower surface of the encapsulation 43a is spaced from the phosphor film 30a, and the thickness of the encapsulation 43a formed is less than the thickness of the housing 40a.

Second Embodiment

Figure 4:
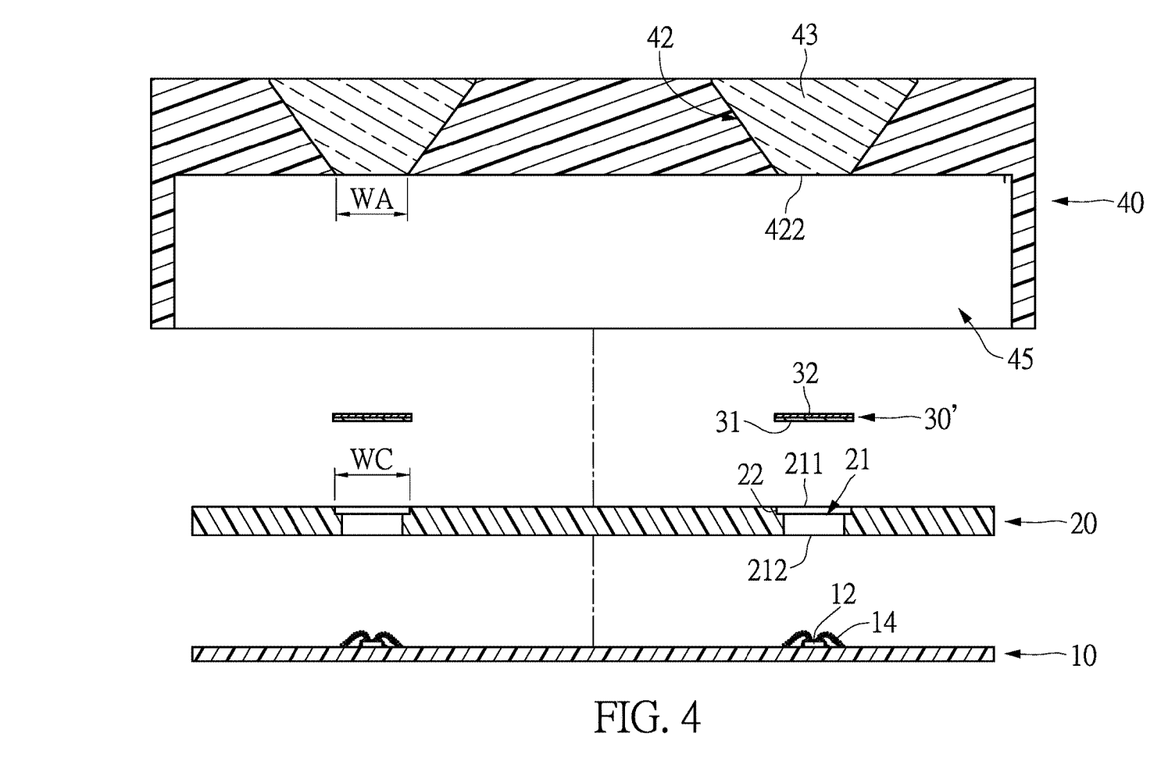
FIG. 4 is a schematic exploded diagram of a second embodiment of a light-emitting display according to the present disclosure.

Please refer to FIG. 4, which is a cross-sectional assembly diagram of the second embodiment of the light-emitting display according to the present disclosure. The difference from the first embodiment lies in that, the present disclosure has a phosphor film 30' of a different structure. The phosphor film 30' has a transparent substrate 31, and a first fluorescent material mixed layer 32 coated on the transparent substrate 31.

Figure 5:
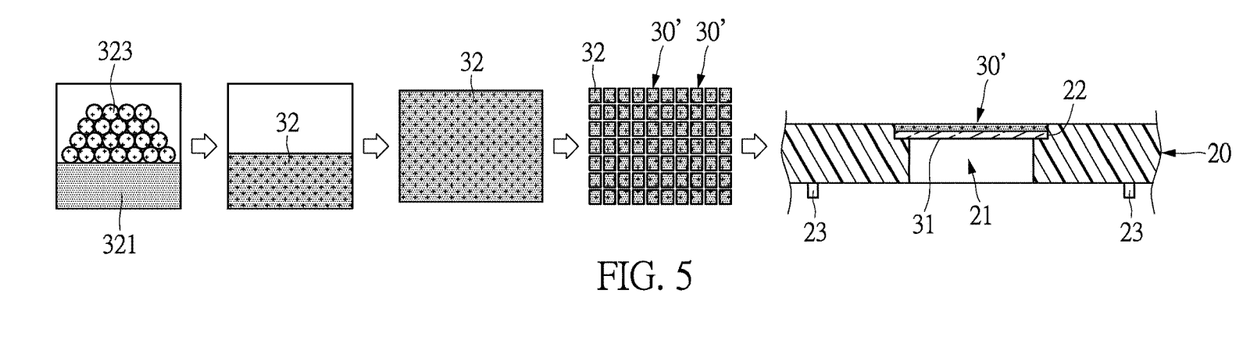
FIG. 5 is a schematic diagram of a manufacturing process of a phosphor film in the second embodiment of the present disclosure.

Please refer to FIG. 5 for a manufacturing method of the phosphor film 30' of the present embodiment. The first fluorescent material mixed layer 32 has a fluorescent material 323 and a curable resin 321. In a mixing process, the fluorescent material 323 and the curable resin 321 are mixed at a corresponding ratio according to a desired display color of the light-emitting display. The curable resin, for example, can be as a thermosetting resin, such as a silicone resin, an epoxy resin, a polyimide resin, a phenol resin, a urea resin, a melamine resin, and an unsaturated polyester resin. Especially for two-step curable type, silicone resin can be brought into a B-stage state (a semi-cured state) in the first-step reaction and is brought into a C-stage state (a completely cured state) in the second-step reaction. The mixture (as indicated by the reference numeral 32) of the fluorescent material 323 and the curable resin 321 is stirred evenly. The mixture (as indicated by the reference numeral 32) is coated on the transparent substrate 31 to form the first fluorescent material mixed layer 32, and then the first fluorescent material mixed layer 32 is cut into multiple small-sized phosphor films 30' according to a desired display font size. The phosphor film 30' is disposed on a spacer 20 in a predetermined path of a first light ray, that is, on a top edge of a through hole 21 of the spacer 20 in the aspect of the present embodiment. To fix the phosphor film 30' of the present embodiment, another locating portion 22 is formed at the position of an upper opening 211 of the through hole 21 on a top surface of the spacer 20, the phosphor film 30' is disposed at the locating portion 22 and covers the through hole 21, and the thickness of the phosphor film 30' is not greater than the depth of the locating portion 22. In this way, side light leakage can be prevented when light rays pass through the phosphor film 30'. The width of the phosphor film 30' is slightly greater than that of the through hole 21. The position of the through hole 21 corresponds to a desired display pattern of the light-emitting display of the present disclosure. Further, the locating portion 22, which is located at the upper opening 211, of the through hole 21 can present the desired display pattern of the light-emitting display of the present disclosure; for example, if the desired display pattern of the light-emitting display is seven segments of the digit 8, the positions of the locating portions 22 also correspond to the seven segments of the digit 8.

Figure 6:
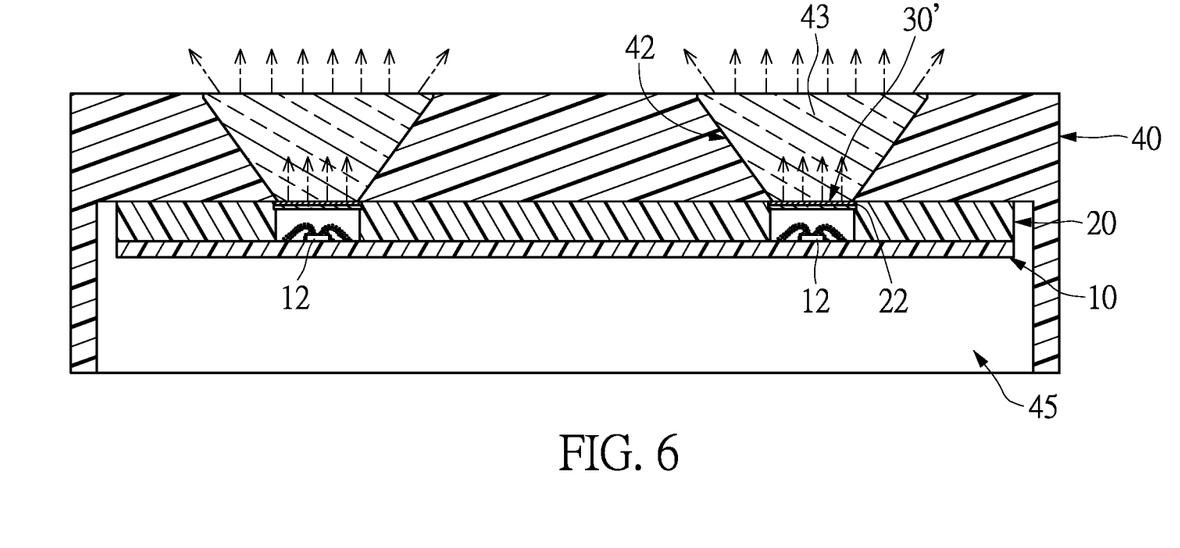
FIG. 6 is a cross-sectional assembly diagram of the second embodiment of the light-emitting display according to the present disclosure.

Please refer to FIG. 6, which is a cross-sectional assembly diagram of the second embodiment of the light-emitting display according to the present disclosure. Then, the circuit board 10, the spacer 20, and the phosphor film 30' are accommodated in an accommodating space 45 of a housing 40. An encapsulant is then filled into a reflecting portion 42. In the present embodiment, the reflecting portion 42 is filled up with the encapsulant. To meet the requirement of a high-temperature encapsulant pouring process, the transparent substrate 31 has a hardness greater than a hardness of 1H on the Mohs scale, and is preferably made of a material with a melting point higher than 90 degrees Celsius.

A preferable dimensional arrangement of the second embodiment of the light-emitting display according to the present disclosure is as shown in FIG. 4, wherein a bottom surface of the housing 40 has a bottom opening 422 corresponding to the reflecting portion 42, a width WA of the bottom opening 422 is less than or equal to a width WC of the locating portion 22, and the width WC of the locating portion 22 is greater than or equal to a width of a lower opening 212 of the spacer 20.

Figure 5A:
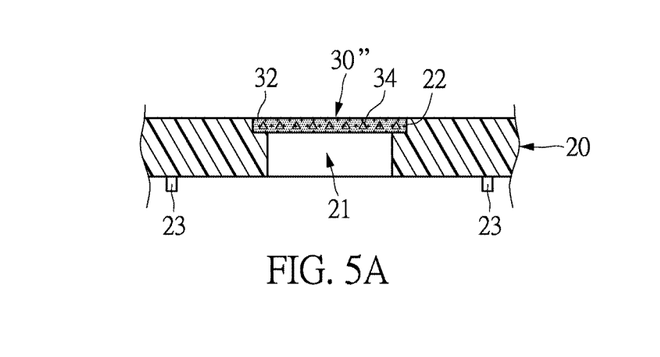
FIG. 5A is a schematic diagram of another manufacturing process of the phosphor film in the second embodiment of the present disclosure.

Please refer to FIG. 5A, which is a cross-sectional schematic diagram of another embodiment of the phosphor film according to the present disclosure. The difference from the previous embodiment lies in that, the transparent substrate may be omitted from the phosphor film 30" of the present embodiment, and the phosphor film 30" has a first fluorescent material mixed layer 32 and a structure reinforcing material 34, and the structure reinforcing material 34 may be, for example, glass, glass fiber, ceramic, or the like, but is not limited thereto. A drying process may be added when necessary, for drying and/or curing the mixture to form the phosphor film. The phosphor film 30" preferably has a hardness greater than a hardness of 1H on the Mohs scale and has a melting point higher than 90 degrees Celsius.

Figure 6A:
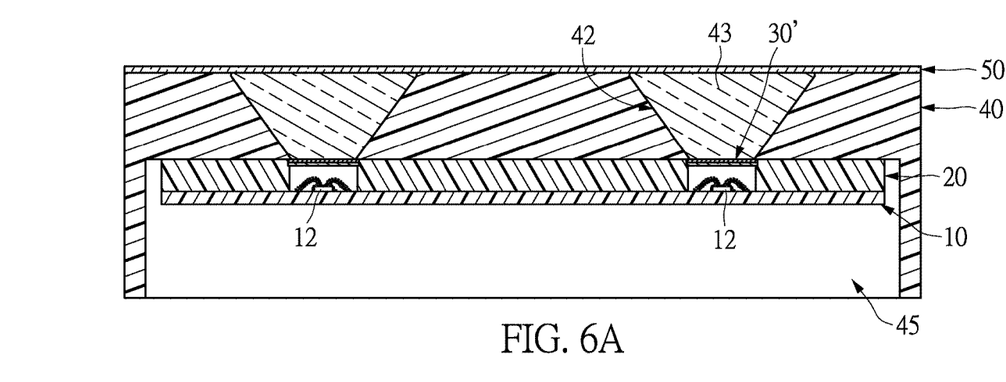
FIG. 6A to FIG. 6D are cross-sectional assembly diagrams of different implementations of the second embodiment of the light-emitting display according to the present disclosure.
Figure 6B:
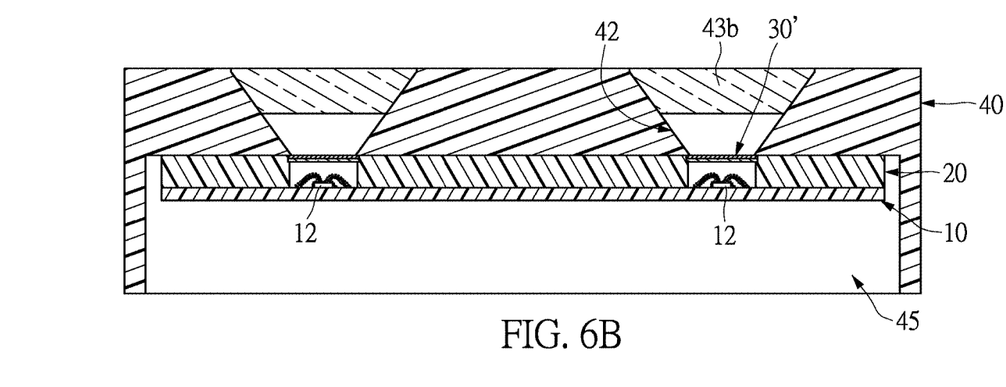
Figure 6C:
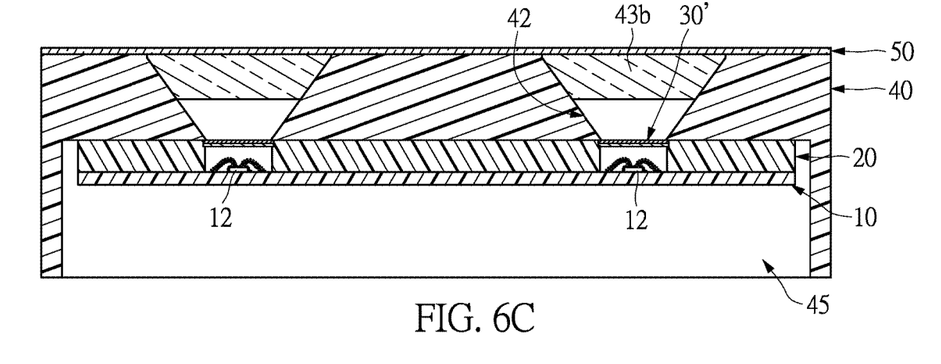

Please refer to FIG. 6A to FIG. 6C, which are cross-sectional assembly diagrams of different implementations of the second embodiment of the light-emitting display according to the present disclosure. An upper surface of the encapsulation (43, 43b) is expected to be flush with or to be slightly recessed relative to a top surface of the housing 40. That is, the combination of the encapsulation (43, 43b) and the reflecting portion 42 of the housing 40 provides an approximately flat top surface (a light output surface) of the light-emitting display. As shown in FIG. 6A, the entire reflecting portion 42 is filled up with the encapsulant. The thickness of the encapsulation 43 is equal to the thickness of the housing 40, wherein an upper surface of the encapsulation 43 is flush with the top surface of the housing 40, and a lower surface of the encapsulation 43 is flush with a top surface of the phosphor film 30'. As shown in FIG. 6B and FIG. 6C, the housing 40 may be turned upside down, and a predetermined amount of the encapsulant is filled into part of the reflecting portion 42, such that the upper surface of the encapsulation 43b is flush with the top surface of the housing 40, the lower surface of the encapsulation 43b is spaced from the phosphor film 30' with a gap between the two. In other words, the thickness of the encapsulation 43b is made to be less than the thickness of the housing 40. Moreover, as shown in FIG. 6A and FIG. 6C, the light-emitting display of the present disclosure may further have an overlayer 50 to display a desired character or pattern of a product, and the overlayer 50 covers the top surface of the housing 40.

Figure 6D:
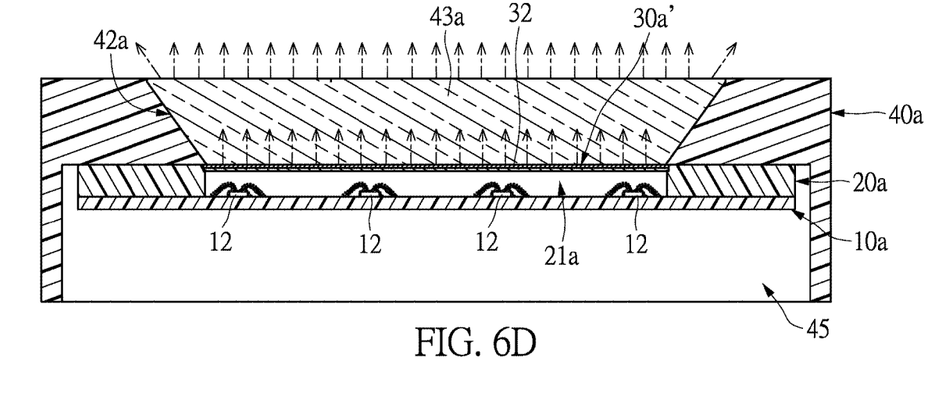

Please refer to FIG. 6D, which is a cross-sectional assembly diagram of a light-emitting display having multiple light sources according to the present disclosure. The main difference from the embodiment shown in FIG. 6 lies in that, a circuit board 10a of the present embodiment has four light sources 12. Similar to FIG. 3D, a spacer 20a accommodates the four light sources 12. There may be a multiple numbers of the light sources 12, for example, two, four, or more. In addition, the multiple light sources 12 may be arranged linearly or in an array. A phosphor film 30a' and a first fluorescent material mixed layer 32 of the phosphor film 30a' have widths that are slightly greater than the width of a through hole 21a of the spacer 20a, and are wide enough to cover the multiple light sources 12. A bottom width of a reflecting portion 42a of a housing 40a is slightly less than that of the first fluorescent material mixed layer 32 (or the phosphor film 30a'), and the reflecting portion 42a may be filled up with an encapsulant. Many first light rays of point-type light emitted by the light sources 12 excites the first fluorescent material mixed layer 32 on the phosphor film 30a' located on a light output path to generate a second light ray of area-type light, which is then reflected out through the encapsulation 43a by the reflecting portion 42a.

It can be understood that the embodiment shown in FIG. 6D may have variations similar to those shown in FIG. 6A to FIG. 6C, that is, an overlayer (not shown) may be disposed on the top surface of the reflecting portion 42a; the encapsulant may be filled into part of the reflecting portion (not shown), such that a top surface of an upper surface of the encapsulation 43a is flush with or slightly recessed relative to the top surface of the housing 40a, a lower surface of the encapsulation 43a is spaced from the phosphor film 30a, and the thickness of the encapsulation 43a formed is less than the thickness of the housing 40a.

Figure 7:
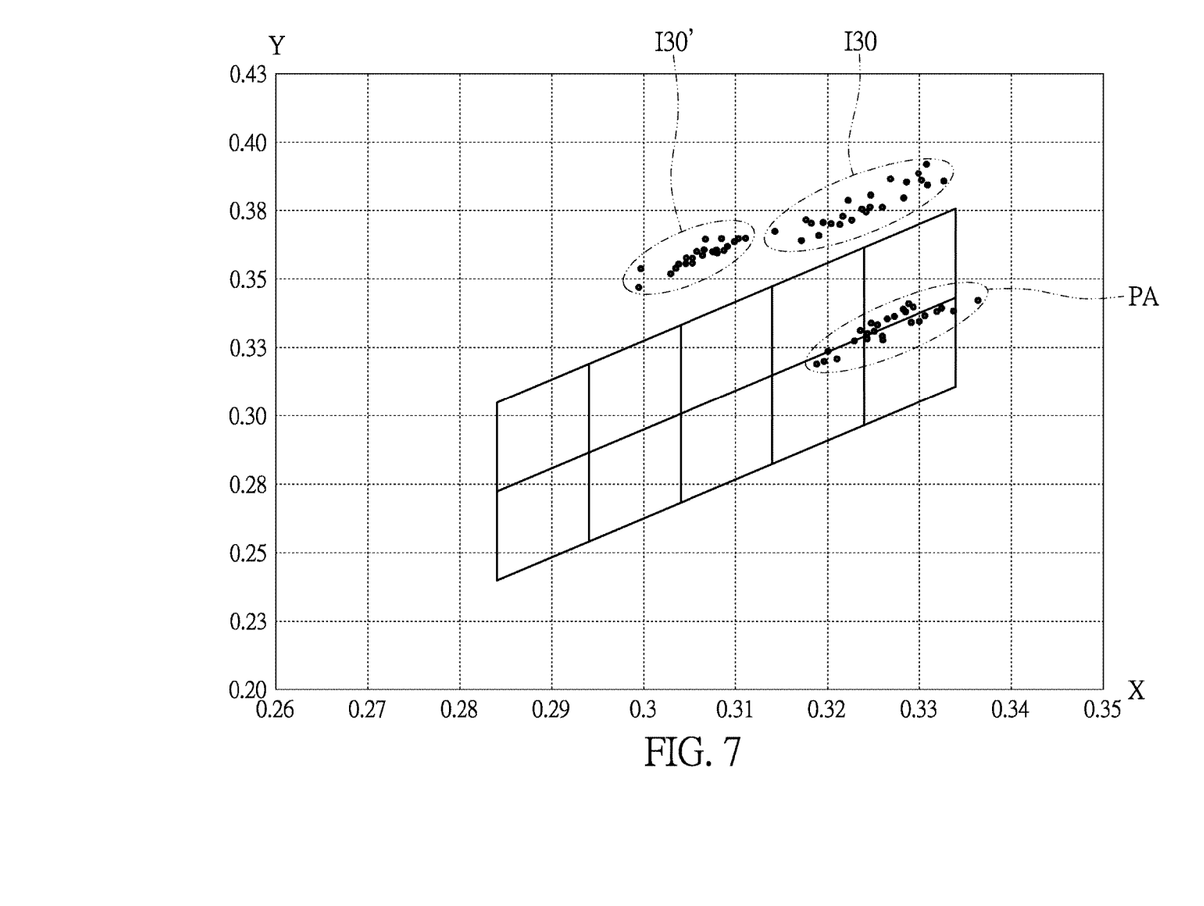
FIG. 7 is a schematic diagram of binning of phosphor films distributed in a chromaticity coordinate system according to the present disclosure.

Please refer to FIG. 7, which is a schematic diagram of binning of phosphor films distributed in a chromaticity coordinate system according to the present disclosure. The advantage of the present disclosure lies in that, chromatic parameters of these phosphor films (30' or 30") can be measured in advance by using a blue source and a spectrograph together with software before a later-stage assembly of a product, to determine whether the chromatic parameters are within a predetermined color point region, which is referred to as BIN (binary) for short, so as to determine the accuracy of color points in advance. Among the three color point regions in FIG. 7, PA represents a comparison group of the prior art, which is within a range of 0.01 to 0.02 on an X-axis; the region 130 represents a binning result of the first embodiment (the method shown in FIG. 2), which is within a range of 0.01 to 0.015 on the X-axis; the region 130' represents a binning result of the second embodiment (the method shown in FIG. 5 and FIG. 5A), which in within a range of 0.005 to 0.01 on the X-axis. This indicates that the phosphor films of the present disclosure can be subject to binning in advance, which is more accurate and can further reduce the range of the color point region. The light-emitting displays of the present disclosure thereby can be of a more uniform chromaticity, such that products can be of more uniform quality.

The present disclosure further provides a method for forming a light-emitting display having a more accurate chromaticity, which has the following steps:

adhering a phosphor film that is obtained after binning and is within a predetermined color point region, for example, the phosphor film 30 shown in FIG. 2 or the phosphor films 30' and 30" shown in FIG. 5 and FIG. 5A, to a spacer 20 with a through hole 21 (as shown in FIG. 2 or FIG. 4), such that the position of the phosphor film 30 corresponds to the position of the through hole 21;

fixedly combining the spacer 20 to a circuit board 10, as shown in FIG. 3 to FIG. 3D, or FIG. 6 to FIG. 6D, the circuit board 10 is provided with at least one light source 12, and the at least one light source 12 is disposed in the through hole 21;

providing a housing 40, wherein a reflecting portion 42 and an accommodating space 45 located below the reflecting portion 42 are formed in the housing 40; and accommodating the circuit board 10, the spacer 20 and the phosphor film (30') in the accommodating space 45 with the reflecting portion 42 located over the phosphor film 30.

Please refer to FIG. 2. According to the first embodiment of the present disclosure, manufacturing and binning steps of the phosphor film 30 are as follows:

mixing a fluorescent material 322 and a curable resin 321 in a corresponding ratio according to a desired display color;

stirring the mixture (refer to the reference numeral 32 in FIG. 2) of the fluorescent material 322 and the curable resin 321 evenly; and coating the mixture on a transparent substrate 31 in a desired display pattern to form a first fluorescent material mixed layer 32, and coating a shading layer 34 on the periphery of the first fluorescent material mixed layer 32. The transparent substrate 31, for example, can be a polyethylene film, or a polyester film (PET or the like).

Please refer to FIG. 5. According to the second embodiment of the present disclosure, manufacturing and binning steps of the phosphor film are as follows:

mixing a fluorescent material 323 and a curable resin 321 in a corresponding ratio according to a desired display color;

stirring the mixture (refer to the reference numeral 32 in FIG. 5) of the fluorescent material 323 and the curable resin 321 evenly;

coating the mixture evenly on the entire surface of the transparent substrate 31, wherein the mixture is semi-cured state; and cutting the transparent substrate 31 and the mixture on thereof into a desired size to form multiple phosphor films 30'. The phosphor film 30' is completely cured.

The manufacturing method for a light-emitting display according to the present embodiment further has performing an optical binning for the cut phosphor films 30', so as to be within a predetermined color point region (as shown in FIG. 7), thus optimizing a uniform light output surface and minimizing a color point distribution region of a finished product.

The features and benefits of the present disclosure lie in that, the light source 12 in the present disclosure is located in the through hole 21 of the spacer 20 having a preset thickness, which can increase reflection paths of light rays. In addition, in the present disclosure, the thickness of the spacer 20 and the size of the through hole 21 can be optimally adjusted according to the size of the light source 12. Moreover, in the present disclosure, a light ray emitted by the light source 12 is diffused after traveling over a distance (which is the preset thickness of the spacer 20), then passes through the phosphor film (30, 30', or 30") to generate an area light source, and then enters the reflecting portion 42 of the housing 40, which can avoid a bright dot phenomenon occurring in the prior art because the light of a point light source directly enters the reflecting portion. Compared with the prior art, the present disclosure does not need a long light mixing distance, thereby reducing the thickness of a finished product of the light-emitting display and usage of the diffusing agent, advantageously achieving a thinner finished product of the light-emitting display and reduced costs.

In addition, according to the embodiments shown in FIG. 3D or FIG. 6D of the present disclosure, a relatively wider phosphor film may be disposed to achieve a uniform illumination effect with fewer light sources 12, thereby reducing costs. Compared with the prior art in which more light sources are used for a light mixing effect, the present disclosure can reduce the number of light sources 12 and provide a more uniform illumination effect.

Moreover, the advantage of the present disclosure further lies in that, by means of a stable film printing process (providing a uniform phosphor distribution) and a pad structure (providing phosphor films with consistent light-intensity areas), the color point distribution is more concentrated, which can more desirably meet an overall light emitting uniformity requirement of the display.

The encapsulation in the embodiments of the present disclosure is not in direct contact with the light source, which can reduce the yellowing of the curable resin caused by direct exposure to light and a heating source, and therefore can significantly improve the service life and reliability of the product.

In the method for forming a light-emitting display according to the present disclosure, before later-stage assembly, a phosphor film having more accurate color points is found by means of optical testing and screening, such that the color points of light rays emitted by the finished product of the light-emitting display can better be within a range previously specified by a customer.

The above description only provides preferred feasible embodiments of the present disclosure, and all equivalent changes and modifications made according to the claims of the present disclosure fall within the scope of the present disclosure.

What is claimed is:

1. A light-emitting display, comprising:
a circuit board, provided with at least one light source and configured to emit a first light ray;
a spacer, disposed on a top surface of the circuit board and having a through hole, wherein the through hole corresponds to the at least one light source, a top surface of the spacer is provided with an upper opening corresponding to the through hole, and a bottom surface of the spacer is provided with a lower opening corresponding to the through hole;
a phosphor film, located on a light output path of the first light ray, comprising a first fluorescent material and capable of emitting a second light ray when excited by the first light ray; and
a housing having a reflecting portion and an accommodating space located below the reflecting portion, wherein the reflecting portion is located over the phosphor film, wherein the accommodating space accommodates the circuit board, the spacer, and the phosphor film.

2. The light-emitting display according to claim 1, further comprising a light-transmissive member encapsulated on the light source, so as to protect the light source, wherein the light-transmissive member may optionally comprise a second fluorescent material.

3. The light-emitting display according to claim 1, wherein the bottom surface of the spacer has multiple locating projections, and the circuit board is provided with locating holes corresponding to the multiple locating projections.

4. The light-emitting display according to claim 1, wherein the phosphor film comprises a transparent substrate and a first fluorescent material mixed layer coated on the transparent substrate, and the phosphor film is disposed on the top surface of the spacer.

5. The light-emitting display according to claim 4, wherein the transparent substrate has a hardness greater than a hardness of 1H on the Mohs scale, and a melting point higher than 90 degrees Celsius.

6. The light-emitting display according to claim 4, wherein the reflecting portion has a through hole, a top surface of the reflecting portion is provided with a top opening corresponding to the through hole, and a bottom surface of the reflecting portion is provided with a lower opening corresponding to the through hole, the width of the bottom opening is less than or equal to that of the first fluorescent material mixed layer, and the width of the first fluorescent material mixed layer is greater than or equal to that of the upper opening of the spacer.

7. The light-emitting display according to claim 4, wherein the spacer further comprises a locating portion formed on the periphery of the upper opening, and the phosphor film is disposed at the locating portion and covers the upper opening.

8. The light-emitting display according to claim 4, wherein the phosphor film further comprises a shading layer coated on the transparent substrate and located on the periphery of the first fluorescent material mixed layer.

9. The light-emitting display according to claim 8, wherein a position of the shading layer corresponds to a position on the spacer other than the upper opening.

10. The light-emitting display according to claim 1, wherein the reflecting portion of the housing is filled with an encapsulant to form an encapsulation, a top surface of the encapsulation is flush with or is recessed relative to an upper surface of the housing, and the thickness of the encapsulation is equal to or less than that of the housing.

11. The light-emitting display according to claim 1, further comprising an overlayer, wherein the overlayer covers a top surface of the housing.

12. The light-emitting display according to claim 1, wherein the phosphor film comprises a first fluorescent material mixed layer and a structure reinforcing material, wherein the structure reinforcing material comprises glass, glass fiber, or ceramic.

13. A method for forming the light-emitting display of claim 1, comprising the following steps:
   adhering a phosphor film that is obtained after binning and is within a predetermined color point region to a spacer, wherein the spacer has a through hole, such that a position of the phosphor film corresponds to a position of the through hole;
   fixedly combining the spacer to a circuit board, wherein the circuit board is provided with at least one light source, and the at least one light source is disposed in the through hole;
   providing a housing, wherein a reflecting portion and an accommodating space located below the reflecting portion are formed in the housing; and
   placing the circuit board, the spacer and the phosphor film in the accommodating space, wherein the reflecting portion is located over the phosphor film.

14. The method for forming the light-emitting display according to claim 13, wherein manufacturing and binning steps of the phosphor film are as follows:
   mixing a fluorescent material and a curable resin in a corresponding ratio according to a desired display color;
   stirring the mixture of the fluorescent material and the curable resin evenly; and
   coating a shading layer on a transparent substrate with a plurality of uncovered areas in a desired display pattern, and coating the mixture on the transparent substrate in the uncovered areas of the shading layer in desired display pattern to form a first fluorescent material mixed layer.

15. The method for forming the light-emitting display according to claim 13, wherein manufacturing and binning steps of the phosphor film are as follows:
   mixing a fluorescent material and a curable resin in a corresponding ratio according to a desired display color;
   stirring the mixture of the fluorescent material and the curable resin evenly;
   coating the mixture evenly on a transparent substrate; and
   cutting the transparent substrate into a desired size to form multiple phosphor films.

16. The method for forming the light-emitting display according to claim 15, further comprising the following step:
   performing optical binning for the cut phosphor films so as to be within a preset color point region and reduce a distribution region of the phosphor films.

17. The method for forming the light-emitting display according to claim 13, wherein manufacturing and binning steps of the phosphor film are as follows:
   mixing a fluorescent material and a curable resin in a corresponding ratio according to a desired display color of the light-emitting display;
   adding a structure reinforcing material;
   stirring the mixture of the fluorescent material, the curable resin, and the structure reinforcing material evenly; and
   drying the mixture to form the phosphor film.

18. A light-emitting display, comprising:
   a circuit board, provided with at least one light source and configured to emit first light ray;
   a spacer, disposed on a top surface of the circuit board and having a first side and a second side; the spacer defining a first optical path extending from the first side of the spacer to the second side of the spacer; and the at least one light source mounted directly to a portion of the first side of the spacer opposite the second side of the spacer such that first light ray emitted by the light source propagates from the light source to the second side of the spacer via the first optical path;
   a phosphor film, associated with the second side of the spacer, and containing a first fluorescent material and capable of emitting a second light ray when excited by the first light ray; and
   a housing, disposed above the spacer and the circuit board and having a reflecting portion and an accommodating space located below the reflecting portion, wherein the accommodating space accommodates the circuit board, the spacer, and wherein the reflecting portion is located over the phosphor film and defining a second optical path extending from the first side of the reflecting portion to the second side of the reflecting portion such that second light ray propagates from the phosphor film to the second side of reflecting portion via the second optical path.

19. The light-emitting display according to claim 18, wherein the phosphor film comprises a transparent substrate and a first fluorescent material mixed layer coated on the transparent substrate, and the transparent substrate has a hardness greater than a hardness of 1H on the Mohs scale, and a melting point higher than 90 degrees Celsius.

20. The light-emitting display according to claim 18, wherein a thickness of the spacer is greater than 0.4 mm.

* * * * *